(12) United States Patent
Chung

(10) Patent No.: US 6,353,420 B1
(45) Date of Patent: Mar. 5, 2002

(54) WIRELESS ARTICLE INCLUDING A PLURAL-TURN LOOP ANTENNA

(75) Inventor: Kevin Kwong-Tai Chung, Princeton, NJ (US)

(73) Assignee: Amerasia International Technology, Inc., Princeton Junction, NJ (US)

(*) Notice: Subject to any disclaimer, the term of this patent is extended or adjusted under 35 U.S.C. 154(b) by 0 days.

(21) Appl. No.: 09/411,849

(22) Filed: Oct. 4, 1999

Related U.S. Application Data

(60) Provisional application No. 60/131,377, filed on Apr. 28, 1999, provisional application No. 60/134,656, filed on May 18, 1999, and provisional application No. 60/136,917, filed on Jun. 1, 1999.

(51) Int. Cl.$^7$ .................................................. H01Q 1/36
(52) U.S. Cl. .............................. 343/895; 343/700 MS; 235/441
(58) Field of Search .......................... 343/895, 700 MS, 343/873; 235/488, 441, 492; 340/572.1; 361/737; 257/679, 777, 778

(56) References Cited

U.S. PATENT DOCUMENTS

| | | | |
|---|---|---|---|
| 5,019,700 A | * 5/1991 | Tada et al. | ................... 325/492 |
| 5,404,581 A | 4/1995 | Honjo | |
| 5,430,441 A | 7/1995 | Bickley et al. | ......... 340/825.54 |
| 5,463,404 A | 10/1995 | Wall | .................... 343/700 MS |
| 5,519,201 A | 5/1996 | Templeton, Jr. et al. | |
| 5,541,399 A | 7/1996 | de Vall | |
| 5,574,470 A | 11/1996 | de Vall | ....................... 343/895 |
| 5,598,032 A | 1/1997 | Fidalgo | ..................... 257/679 |
| 5,751,256 A | 5/1998 | McDonough, et al. | ...... 343/873 |
| 5,847,931 A | 12/1998 | Gaumet et al. | ............. 361/737 |
| 5,880,934 A | 3/1999 | Haghiri-Tehrani | .......... 361/737 |
| 5,892,611 A | 4/1999 | Stafford et al. | |
| 5,892,661 A | 4/1999 | Stafford et al. | ............. 361/737 |
| 5,903,239 A | 5/1999 | Takahashi et al. | |
| 5,909,050 A | 6/1999 | Furey et al. | ................ 257/531 |
| 6,018,299 A | 1/2000 | Eberhardt | |
| 6,049,461 A | 4/2000 | Haghiri-Tehrani et al. | |

OTHER PUBLICATIONS

*International Search Report*, PCT/US00/09145, Aug. 15, 2000 (4 pages).

Dr. Elke Zakel, "Smart Cards —An Overview",*IEEE, —Second Workshop On Smart Card Technologies And Applications*, Berlin, Nov. 16–18, 1998.

Jorge Vieira da Silva, Contact Less Smart Cards: European applications, co–operative developments and industrial supply environment, *EEE Second Workshop on Smart Card Technologies And Applications*, Berlin Nov. 16–18, 1998; 18 pages.

Peter Stampka, "Second Generation Contactless Cards, " *IEEE Second Workshop on Smart Card Technologies And Applications*, Berlin Nov. 16–18, 1998; 8 pages.

E. Zakel, "Advanced Packaging for Smart Cards", *IEEE Second Workshop on Smart Card Technologies And Applications*, Berlin Nov. 16–18, 1998, 4 pages.

(List continued on next page.)

*Primary Examiner*—Don Wong
*Assistant Examiner*—Trinh Vo Dinh
(74) *Attorney, Agent, or Firm*—Dann, Dorfman, Herrell & Skillman, P.C.

(57) ABSTRACT

A wireless article, such as an identification tag of badge, containing an electronic device includes on a substrate thereof a plural-turn loop antenna for receiving and/or transmitting radio frequency signals. Because the spacing of the loop antenna terminals is greater than the spacing of the contacts to which they are to connect on the electronic device, the electronic device cannot be attached to the same side of the wireless article as is the loop antenna. Electrically conductive material disposed in holes through the substrate of the wireless article connect the antenna terminals to the electronic device contacts.

79 Claims, 3 Drawing Sheets

OTHER PUBLICATIONS

Dymax Europe GmbH,"UV Curing Resins For Smart Cards Innovations For Smart Cards", *IEEE Second Workshop on Smart Card Technologies And Applications*, Berlin Nov. 16–18, 1998, 4 pages.

K. Haberger et al. "Comparison of Different Methods to Make Extremely Thin IC's", *IEEE Second Workshop on Smart Card Technologies And Applications*, Berlin Nov. 16–18, 1998, 6 pages.

Reinhard Jurisch, "Coil on Chip Technology for Closed Couping Contactless Chip Cards", MICROSENSYS, *IEEE Second Workshop on Smart Card Technologies and Applications 98*, 5 pages.

Kevin Chung, Ph.D., "Smart Card Die–Attach And Module Lamination Alternatives", *IEEE Second Workshop on Smart Card Technologies And Applications*, Berlin Nov. 16–18, 1998, 9 pages.

"Dupont Photopolymer & Electronic Materials", *IEEE Second Workshop on Smart Card Technologies And Applications*, Berlin Nov. 16–18, 1998, 17 pages.

Günter Schiebel, "Low Cost Smart Card/RFID Assembly Using Flip Chip Shooters"Siemens AG, *IEEE Second Workshop on Smart Card Technologies And Applications*, Berlin Nov. 16–18, 1998, 12 pages.

* cited by examiner

WIRELESS ARTICLE INCLUDING A PLURAL-TURN LOOP ANTENNA

This Application claims the benefit of U.S. Provisional Application Serial No. 60/131,377 filed Apr. 28, 1999, of U.S. Provisional Application Serial No. 60/134,656 filed May. 18, 1999, and of U.S. Provisional Application Serial No. 60/136,917 filed Jun. 1, 1999.

The present invention relates to a wireless article and, in particular, to a wireless article including an antenna having plural turns.

Wireless articles, such as tags, identification badges, smart cards and the like, are in wireless communication with a base unit or reader via a radio-frequency (RF) communication link. RF transmissions transmitted by the base unit may be received by an antenna on the wireless article or RF transmissions transmitted by the wireless article by an antenna thereon may be received by the base unit. Or RF transmissions by each of the wireless article and the base unit may be received by the other one thereof.

In each case, the RF signals either received or transmitted by the wireless article are received or transmitted by an antenna thereon. Because wireless articles are usually desired to be small in size, the antenna thereon must also be small in size. For a loop-type antenna, the sensitivity of the antenna to small amplitude RF signals and the amplitude of the RF signals transmitted by the antenna are a direct function of the area enclosed by the antenna loop and the number of turns of the conductor forming the loop. For a small tag or badge, the size thereof limits the area that an antenna loop can enclose, thereby limiting the RF performance of the antenna.

Antenna RF performance may be improved by increasing the number of turns or loops of conductor that the antenna will have. The terminal at one end of the loop antenna will be outside the loops and the terminal at the other end thereof will be inside the loops. Thus, as more turns or loops are added, the antenna terminals necessarily become spaced further apart. When the loop antenna terminals are to directly connect to an electronic device, adding turns to the antenna soon increases the antenna terminal spacing until it exceeds the distance between the contacts on the electronic device to which the antenna terminals are to connect, thereby necessitating a further degree of undesirably increasing the complexity and cost of the article.

Accordingly, there is a need for a wireless article having a plural-turn antenna that is relatively simple and that can be made relatively inexpensively.

To this end, the present invention comprises a substrate having at least one hole therethrough, an elongated electrical conductor on one surface of the substrate and having at least one end at the hole of the substrate, a pattern of electrically-conductive adhesive on a second surface of the substrate, the electrically-conductive adhesive being electrically connected to the elongated electrical conductor through the at least one hole in the substrate and having at least one contact, and an electronic device attached to the substrate and having at least one contact electrically connected to the contact of the pattern of electrically-conductive adhesive.

According to another aspect of the invention, a method of making a wireless article comprises:

providing a substrate having holes therethrough and an elongated conductor on a first surface thereof having ends of the elongated conductor extending at least partially over the holes;

depositing electrically-conductive material in the holes to electrically connect to the elongated conductor;

depositing a pattern of electrically-conductive adhesive on a second surface of the substrate to electrically connect the elongated conductor to first and second contacts; and attaching first and second contacts of an electronic device to the first and second contacts of the pattern of electrically-conductive adhesive on the substrate.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENT

Figure 1:
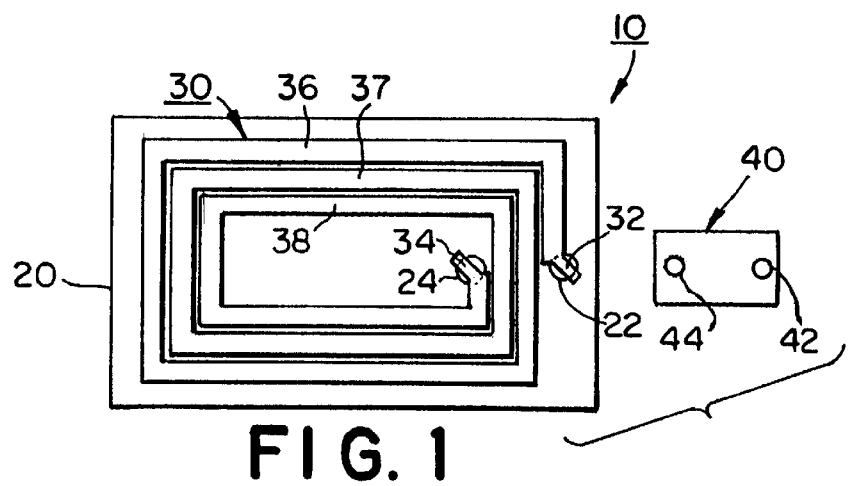
FIG. 1 is a plan view of one surface of an exemplary embodiment of a substrate useful in an article according to the present invention.

In FIG. 1, substrate 20 for a wireless article 10 is a generally planar sheet of an insulating material. A loop antenna 30 is formed of an elongated conductor having a plurality of loops or turns 36, 37, 38 generally in a spiral pattern on one surface of substrate 20. The ends 32, 34 of loop antenna 30 located at the respective ends of outermost loop or turn 36 and innermost loop or turn 38, respectively, define antenna terminals 32, 34. Illustrated along surface substrate 20, an electronic device 40, such as a semiconductor integrated circuit, a hybrid circuit or other suitable electronic device, has two spaced-apart contacts 42, 44.

Usually, the spacing between the two contacts 42, 44 of electronic device 40 are a given dimension that is determined by the supplier of the electronic device 40 and so is not easily changed. As a result, the spacing between contacts 42, 44 of electronic device 40 defines the spacing of the contacts on substrate 20 to which electronic device 40 connects, i.e. the desired spacing between holes 22, 24 of substrate 20. Regarding the exemplary substrate 20 of FIG. 1, the width of and the number of turns of loop antenna 30 are sufficiently large so that electronic device 40 cannot be attached to substrate 20 on the same surface as loop antenna 30 because of the likelihood of an electrical short circuit being formed. Such short may occur between adjacent loops, such as loops 36-37 or loops 37-38 of loop antenna 30 by the spreading or flowing of the electrically-conductive material which would be utilized to make electrical connection between antenna terminals 32, 34 and electronic device contacts 42, 44 when electronic device 40 is attached to the same surface of substrate 20 as is antenna 30. Additionally, other parts of electronic device 40 could come into unwanted electrical connection or coupling to one or more of the turns 36, 37, 38, for example, one or more of the intermediate turns 37, of antenna 30.

To avoid the possibility of such unwanted short circuits, substrate 20 has two vias or holes 22, 24 spaced apart a distance corresponding substantially to the spacing between antenna terminals 32, 34. Loop antenna 30 and substrate 20 are positioned so that the two terminals 32, 34 of loop antenna 30 overlie the two vias or holes 22, 24 through substrate 20, whereby electrical contact may be made with antenna terminals 32, 34 from the other surface of substrate 20 through holes 22, 24, respectively. It is noted that antenna 30 is preferably, but need not be, a generally spiral conductor pattern located close to the edges of substrate 20 so as to increase the area encompassed thereby, and may be of a circular spiral, oval or elliptical spiral, square or rectangular spiral, or other convenient pattern, including a free-form shape.

Figure 2:
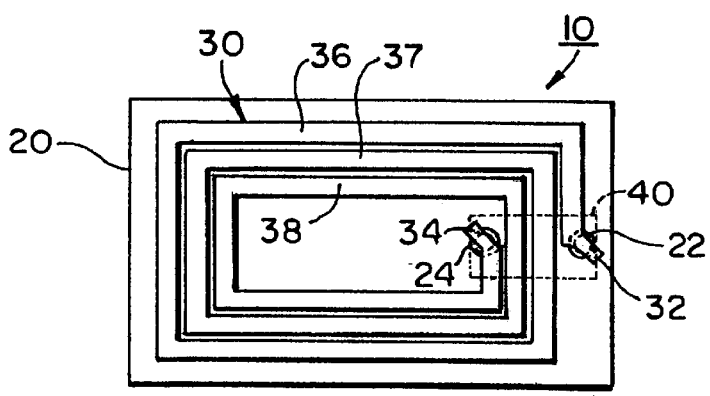
FIG. 2 is a plan view of the article of FIG. 1 with an electronic device attached thereto.
Figures 3A, 3B:
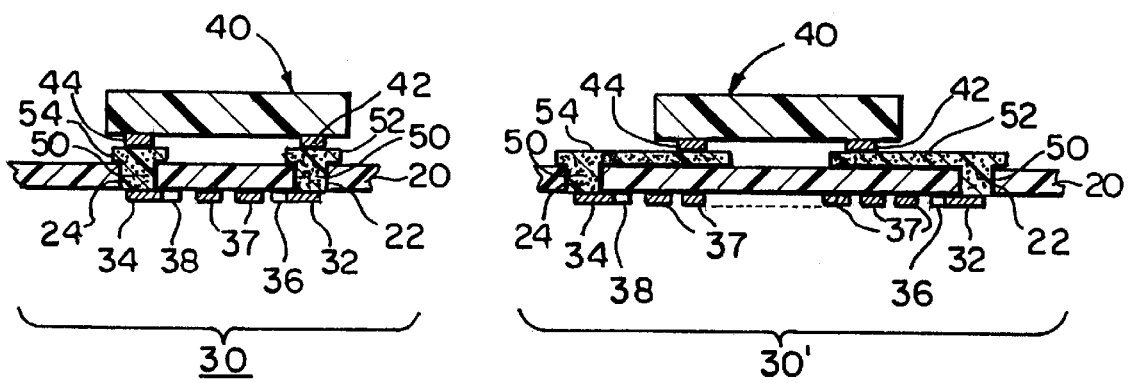
FIGS. 3A and 3B are side cross-sectional views of part of the article of FIG. 2 showing the connection of the electronic device thereto.

To assemble wireless article 10 of FIG. 2, antenna 30 is formed on or attached to a first surface of substrate 20, the holes 22, 24 of substrate 20 are filled with an electrically-conductive material that will form the electrical connections between antenna terminals 32, 34 and device contacts 42, 44, respectively, and the electronic device 40 (shown in phantom) is attached to the opposing surface of substrate 20. The resulting wireless article 10, a portion of which is shown in cross-section in FIG. 3A, includes substrate 20 having holes 22, 24 therein filled with electrically-conductive material 50 which extends therefrom to form conductive features or "bumps" 52, 54. Conductive material 50 also provides electrical connection to terminals 32, 34 of antenna 30. Contacts 42, 44 of electronic device 40 connect to conductive bumps 52, 54 and may be pressed into place when the material of bumps 52, 54 is an electrically-conductive adhesive. Connection of contacts 42, 44 to bumps 52, 54 of electrically-conductive adhesive may be made by pressing electronic device 40 in place against substrate 20 when electrically-conductive adhesive of bumps 52, 54 is wet or may be made by so pressing device 40 into place with appropriate heating to provide melt flow bonding after adhesive bumps 52, 54 are dried or B-staged.

The present invention is particularly advantageous where the number of turns of antenna 30 is sufficiently large that the distance between antenna contacts 32 and 34 is greater than the distance between contacts 42, 44 of electronic device 40. As shown in the exemplary embodiment of FIG. 3B, for example, conductive material 50 is deposited to fill holes 22, 24 and to form conductive strips (i.e. conductors) 52, 54 extending from the electrically-conductive material 50 in widely spaced holes 22, 24 to locations spaced apart the same distance as are contacts 42, 44 of electronic device 40. Contacts 42, 44 of electronic device 40 then connect to the ends of conductive strips 52, 54 and may be pressed into place when the material of bumps 52, 54 is electrically-conductive adhesive. Connection of contacts 42, 44 to conductors 52, 54 of electrically-conductive adhesive may be made by pressing electronic device 40 in place against substrate 20 when the electrically-conductive adhesive of conductive strips 52, 52 is wet or may be made by so pressing device 40 into place with appropriate heating to provide melt flow bonding after adhesive strips 52, 54 are dried or B-staged.

It is noted that the portion of conductors 50 filling holes 22, 24 may be formed of a variety of materials, such as by building up metal, such as by plating copper, beryllium copper, brass and other copper alloys, or nickel or aluminum or other suitable metal, to fill holes 22, 24, or may be made by depositing electrically-conductive adhesive to fill holes 22, 24, such as by screen printing, stenciling and the like. It is further noted that one or more additional deposits of electrically-conductive adhesive onto substrate 20 may be utilized if it is desired to increase the height of conductors and/or bumps 52 from what is obtained with a single deposition of adhesive. Further, electrically-conductive adhesive bumps may be deposited on the contacts 42, 44 of electronic device 40 with like result. In addition, a layer of metal, such as nickel, gold, nickel-gold and the like may be deposited, such as by plating, onto conductors 50, 52, 54 formed of electrically-conductive adhesive, either to increase the height thereof or to facilitate connections of the contacts of electronic devices 40 to the plated contacts 50, 52, 54 with solder, e.g., with solder bumps as in the mounting of conventional flip-chip components.

The present invention is substantially different from conventional plated-through holes as in conventional printed circuit wiring boards, whether of single layer or multi-layer type, and whether of rigid or flexible type, wherein plating is deposited on the interior surface of the holes to make electrical contact with the thin edges of metal conductors that are on various ones of the surfaces and layers thereof. Here, on the other hand, conductive material is built up to fill the hole and contacts the broad surface of the conductors on the surface of the substrate, either through physical contact or by being part thereof as in the case of deposited conductive adhesive.

Wireless article 10 is fabricated as follows. A substrate 20, preferably of sheet poly-vinyl-chloride (PVC), polyimide, poly-ethylene terephthallate (PET), polybutylene terephthallate, or polyester such as polyester terephthallate, polymer blends, paper film, dried or B-staged insulating adhesive or other suitable substrate material, is provided, and holes 22, 24 are made therein, such as by die cutting, punching, drilling, mechanical drilling, laser drilling or cutting, photoresist and etching, or other suitable method. The sheet is typically about 0.75 mm thick (about 0.03 inch thick), but may range between 0.05 and 1.0 mm thick (about 0.002 to 0.040 inch thick, i.e. 2–40 mils). Preferably, a sheet of the substrate material that is large enough to be cut into a plurality of substrates is provided, such as a 280 mm by 280 mm (about 11 inch by 11 inch) sheet on which a 3 by 4 array of 12 substrates, each about 83.5 mm by 132.9 mm (about 2.125 inch by 3.375 inch), may be formed. Preferably, the sheet is processed to contemporaneously form an array of wireless articles 10 thereon before it is excised or cut to separate the individual wireless articles 10.

Alternatively, substrate 20 can be formed by screen printing or stencil printing a dielectric adhesive layer having holes 22, 24 therein defined by the pattern of the screen or stencil utilized. This method is preferred where the loops 36, 37, 38 of antenna 30 are photo-etched from a sheet of metal foil laminated to such dielectric adhesive layer substrate 20, such as by photo-etching as utilized in the making of conventional printed wiring circuit boards.

A stencil, screen or mask defining the pattern of an array of antennae 30 corresponding to the array of substrates is positioned with the sheet of substrate material and an electrically conductive adhesive 50 is deposited on a first surface thereof in the pattern of the array of antennae 30. Typically, the substrate 20 is between about 0.25 mm and 1 mm thick (about 10–40 mils thick), and the conductors 36, 37, 38 forming antennae 30 are about 250 $\mu$m (about 10 mils) wide and are within the range of about 25 $\mu$m to 125 $\mu$m thick (about 1.0 to 5 mils thick). In most cases, conductors 36, 37, 38 of antenna 30 are about 50–100 μm thick (about 2–4 mils thick) when wet and about 25–75 μm thick (about 1–3 mils thick) after drying or B-staging. The conductive adhesive 50 may completely or partially fill holes 22, 24 in substrates 20. Where holes 22, 24 are larger than about 0.1 mm (about 4 mils) diameter, it is relatively easy to pass sufficient conductive adhesive 50 through the corresponding holes in the stencil, screen or mask to fill holes 22, 24 of substrate 20. Suitable conductive adhesives 50 include, for example, type PSS8150 thermosetting conductive adhesive and type ESS8450 flexible conductive adhesive, both of which are filled with silver particles and are available from AI Technology, Inc. located in Princeton, N.J. The deposited conductive adhesive 50 is dried or B-staged by heating in an oven to about 60° C. for about 60 minutes.

A second deposit of the same conductive adhesive 50 is made in like manner on the opposing surface of the sheet of substrate material. A stencil, screen or mask defining the pattern of contact sets corresponding to the contacts 42, 44 of electronic device 40 and holes 22, 24 for the array of substrates is positioned with the sheet of substrate material and the electrically conductive adhesive 50 is deposited on the opposing surface thereof in the pattern of the array of contacts 42, 44. The electrically conductive adhesive 50 deposited on this second surface of the array of substrates flows into holes 22, 24 to contact the like adhesive deposited of the first surface thereof to form antennae 30 and to form contacts 52, 54 to which contacts 42, 44 of electronic device 40 connect. The materials, application and processing of conductive adhesive 50 is like that utilized with respect to the first surface of the sheet of substrates.

Electronic devices 40 may be positioned to the sheet of substrates either when the adhesive 50 is still wet from being deposited or after adhesive 50 is dried or B-staged. Preferably, electronic devices 40 are flip-chip semiconductor devices with plated or otherwise oxidation resistant contacts 42, 44 that are positioned onto substrates 20 by conventional pick-and-place or flip-chip assembly equipment. Where electronic devices 40 are placed when conductive adhesive 50 is still wet, the sheet of substrates 20 with electronic devices 40 attached thereon is cured to form a sheet of wireless articles 10 which is then excised or cut apart, as by die cutting, laser cutting or the like, into the individual wireless articles 10. Curing of type ESS8450 thermosetting adhesive is performed by heating the wireless article in an oven to a temperature above 100° C. for about 30 minutes or more. For thermoplastic adhesives such as type PSS8150, attachment may be completed by drying out the solvent from the adhesive, e.g., by heating to about 60° C. for about 60 minutes.

Where electronic device 40 bridges one or more turns 37 of antenna 30 or other conductors formed of electrically-conductive adhesive, and particularly where the width or spacing of such conductors is small, i.e. less than about 0.25–0.5 mm (about 10–20 mils), the deposited conductive adhesive is preferably dried or B-staged before attachment of electronic device 40. A second deposition of the same electrically-conductive adhesive is made to deposit a second layer of adhesive on bumps 52, 54 to which electronic device 40 may be attached while the second layer of adhesive is wet or after drying or B-staging. However, where the conductor width or spacing is small, it is preferred that attachment of electronic device 40 be after the second deposition of conductive adhesive on bumps 52, 54 has been dried or B-staged.

Optionally, but in many applications, preferably, an insulating adhesive underfill in liquid form may be applied along the edges of electronic device 40 from where it flows by capillary action to substantially fill the remaining volume between electronic device 40 and substrate 20 that is not filled by conductive adhesive 50. Such adhesive underfill provides additional mechanical strength to the attachment of electronic device 40 to substrate 20 and resistance to moisture and other potential contaminants. Where the electrically-conductive adhesive 50 is a flexible adhesive such as type PSS8150, as is desirable where the substrate 20 is somewhat flexible, a flexible adhesive underfill, such as types MEE7650 and MEE7650-5 flexible epoxy adhesive or type MEE7660 high-strength epoxy adhesive, also available from AI Technology, is preferably utilized.

Also optionally, a protective coating may be applied to wireless article 10 to protect against mechanical damage and environmental conditions, such as moisture, water, solvents, dirt and other materials. One suitable protective coating material is the type MEE7650 flexible insulating adhesive that is also used for underfill of electronic device 40. In such case, the application of the underfill adhesive and of the overcoat adhesive may be accomplished in one operation. For example, where the over coating material is applied in liquid form as by spraying or dipping, the insulating adhesive will flow under electronic device 40 to form the underfill adhesive thereunder contemporaneously with it forming the protective coating. The protective coating may also be sheets of dried or B-staged insulating adhesive laminated to one or both surfaces of wireless article 10.

Flexibility of a material is related to the degree of elongation that a material exhibits before it fails. In general, flexible materials are capable of >30% elongation without failure. Where substrate 20 has a given degree of flexibility, it is preferred that the flexible conductive adhesive material that forms conductors 30, 50 and adhesive layer 58 thereon, for example, be at least as flexible as is substrate 20, i.e. exhibit at least the same or a greater percentage elongation prior to failure.

In an alternative embodiment of the making of wireless article 10, a dielectric layer is deposited on a sheet of release liner material to serve as substrate 20, such as by roll coating, screening stenciling, or other suitable method. Where dielectric layer 20 is formed by screening, stenciling, or other printing method, it is formed with holes 22, 24 therein for conductive adhesive 50. Otherwise, holes 22, 24 are formed in dielectric layer 20 after it is dried or B-staged, such as by die cutting, laser drilling or other suitable method. After dielectric layer 20 is dried or B-staged, antenna 30 and conductive adhesive 50 are applied, electronic device 40 is attached and protective coating layers, if any, are applied, all as described above. Alternatively, The pattern of loop antenna 30 may be formed of conductive adhesive deposited on a sheet of release liner with conductive adhesive bumps 52, 54 formed thereon at the terminals of antenna 30. The deposited conductive adhesive is then dried or B-staged. Then dielectric layer 20 is applied directly over deposited antenna 30 and bumps 52, 54 to a thickness less than or equal to the height of bumps 52, 54, resulting in substrate 20 with antenna 30 and conductive bumps 52, 54 therein, ready for attachment of electronic device 40 thereto. Preferably, an array of wireless articles 10 are made contemporaneously by depositing an array of antennae 30, an array of substrates 20 in one layer, an array of conductive bumps 52, 54, and so forth, resulting in a panel of an array of wireless articles 10 that are then excised, such as by die cutting, rotary cutting, or other suitable method, into individual articles 10.

An alternative embodiment of wireless article 10 employs a metal foil loop antenna 30. A sheet of metal foil, such as a copper or aluminum foil, is provided, typically between about 0.018 mm and 0.10 mm thick (about 0.7 to 4 mils thick). A layer of dielectric material 20 is applied thereto, such as by roll coating, screening or stenciling an insulating adhesive thereon, including holes formed at the locations at which antenna terminals 32, 24 are to be formed in the metal foil. The dielectric layer is preferably formed of an insulating adhesive, such as type ESP7450 thermosetting epoxy adhesive available from AI Technology, Inc. located in Princeton, N.J. Typically, substrate 20 has a dry thickness between about 0.05 mm and 0.5 mm (about 2–20 mils) when employed in an article compliant with an international standard for cards and tags with embedded integrated circuits, but may have a dry thickness between about 0.25 mm and 1 mm (about 10–40 mils) for other uses, and is cured prior to photo-etching of antenna 30 described below. Conductive adhesive 50 is deposited to fill holes 22, 24 in substrate 20 and to provide contacts 52, 54 to which electronic device is to attach, as above, and is also cured prior to photo-etching of antenna 30.

Antenna 30 is made by photo-etching, i.e. by depositing a photoresist material to the exposed surface of the metal foil, exposing and developing the photoresist material to define the pattern of antenna 30 and then etching away the unwanted metal foil material to leave antenna 30 on substrate 20, in like manner to the etching of conventional printed wiring circuit boards, for example. Suitable photoresist and photo-etching materials are widely available in liquid, paste and film form, such as from MacDermid Company located in Connecticut and from E.I duPont de Nemoirs & Company located in Delaware. Suitable insulating adhesives, such as AI Technology type ESP7450, when cured, withstand exposure to the chemicals and environments employed in the photo-etching processes. Preferably, an array of wireless articles 10 are made contemporaneously by depositing an array of substrates 20 in one layer, depositing an array of conductive bumps 52, 54, and etching an array of metal foil antennae 30, and so forth, resulting in a panel of an array of wireless articles 10 that are then excised into individual articles 10.

Alternatively, instead of depositing conductive adhesive 50 into holes 22, 24 in the insulating adhesive substrate 20, a photoresist pattern may be employed to define locations for depositing conductive metal onto antenna 30, either before or after the metal foil is etched to form antenna 30. In particular, conductive metal is deposited onto antenna 30 not only on the exposed surface thereof adjacent the surface of substrate 20, but also onto antenna terminals 32, 34 accessible via holes 22, 24 to plate or otherwise build up a metal conductor to fill holes 22, 24 in substrate 20. If the plating material is copper or other material susceptible to oxidation or other degradation of conduction and adhesion properties, then a metallization or moisture resistant layer or layers of a non-oxidizing or precious metal, such as tin, nickel, silver, gold, palladium, platinum, nickel-gold, or nickel-palladium, or the like, should be applied over the built-up via conductors in holes 22, 24. The building up of such via conductors, which may be performed either before or after the metal layer is photo-etched to form the pattern of antenna 30, as is the plating thereof to facilitate solder bump attachment of the contacts of an electronic device thereto, is further described in U.S. patent application Ser. No. 09/412,052 (AI-TECH-13) entitled "Contact Module, As For a Smart Card, And Method For Making Same" filed by Kevin Kwong-Tai Chung on even date herewith and which is hereby incorporated herein by reference in its entirety. Conductive adhesive contacts 52, 54 are thereafter deposited onto the filled via holes 52, 54 for connecting to contacts 42, 44 of electronic device 40 and attaching same to substrate 20. Conductive adhesive type PSS8150 or type ESS8450, and underfill insulating adhesive type MEE7650 or type MEE7660, all available from AI Technology, are preferred in this embodiment.

It is noted that it is preferred to have the portion of the metal antenna 30 near holes 22, 24 to overlie holes 22, 24, i.e. that the metal trace be left completely or substantially intact, to ease or facilitate making of electrical connection thereto, either directly or through holes 22, 24. Similarly, where antenna 30 is deposited of conductive adhesive, it is preferred to deposit the conductive adhesive to cover holes 22, 24 for the same reason.

Figure 4:
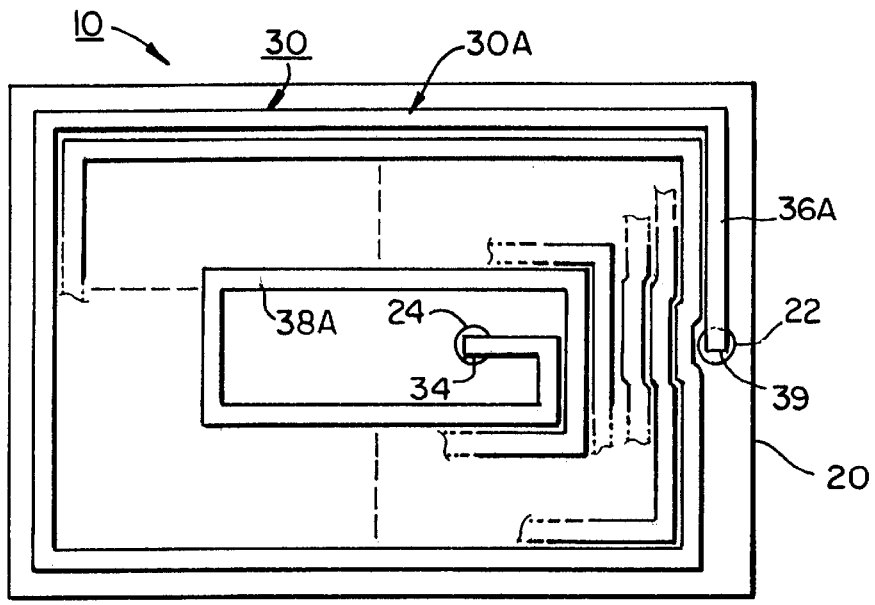
FIGS. 4 and 5 are plan views of respective opposing surfaces of an exemplary embodiment of a substrate useful in an article according to the present invention.
Figure 5:
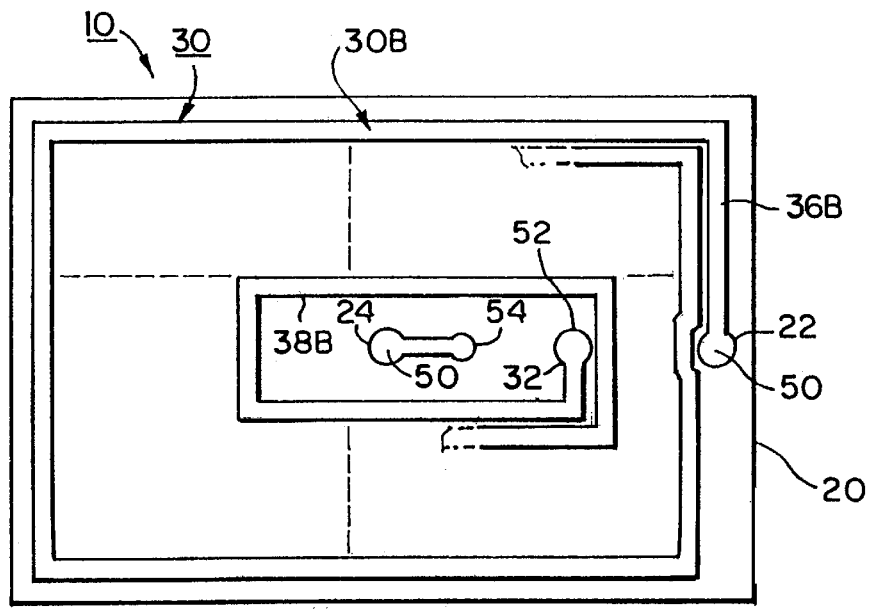

The arrangement of the present invention is also advantageous for wireless articles having antennas with a greater number of turns than can or might be desired to be formed on one surface of a substrate. FIGS. 4 and 5 are plan views of opposing surfaces of an exemplary embodiment of a substrate of an article having such greater number of turns. Antenna 30 thereof comprises antenna portion 30A on the one surface of substrate 20 in series with antenna portion 30B on the other surface thereof Antenna portion 30A includes outermost turn 36A, innermost turn 38A, and intermediate turns 37A therebetween, and may be formed of a pattern of a thin metal foil as shown or of a pattern of deposited conductive adhesive, as described above in relation to FIGS. 1–3. The ends 34, 39 of antenna portion 30A are positioned over holes 24, 22, respectively, in substrate 20, and end 34 serves as one terminal of antenna 30.

Antenna portion 30B includes outermost turn 36B, innermost turn 38B, and intermediate turns 37B therebetween, and is formed of a pattern of conductive adhesive deposited onto substrate 20, as described above in relation to FIGS. 1–3. The depositing of conductive adhesive to form antenna portion 30B preferably also provides conductive material 50 substantially filling holes 22, 24 through substrate 20, although the filling of holes 22, 24 may be accomplished in a separate deposition. As most easily seen in FIG. 5 in conjunction with the sectional view of FIG. 6, terminal 34 of antenna 30 is connected to conductive contact 54 by conductive material 50 filling hole 24 through and deposited on substrate 20. Similarly, end 39 of outermost turn 36A of antenna portion 30A is connected to the end of outermost turn 36B of antenna portion 30B by conductive material 50 filling hole 22 in substrate 20. The other end 34 of deposited antenna portion 30B serves as the second terminal 32 of antenna 30 at which is formed conductive adhesive contact 52. Conductive adhesive contacts 52, 54, which are spaced apart an appropriate distance for receiving the contacts 42, 44, respectively, of electronic device 40 for electrically connecting antenna 30 to electronic device 40, are formed by the deposition forming antenna portion 30A and may be augmented in height by one or more additional depositions of conductive adhesive, as described above. It is noted that each of antenna portions 30A, 30B of antenna 30 is preferably, but need not be, a generally spiral conductor pattern located close to the edges of substrate 20 so as to increase the area encompassed thereby, and may be of a circular spiral, oval or elliptical spiral, square or rectangular spiral, or other convenient pattern, including a free-form shape.

In order to increase the number of turns of antenna portions 30A, 30B, the conductors can be narrowed where they are close to features, such as is shown in FIGS. 4 and 5 where turns 37A and 37B pass near hole 22, that restrict the space available for such conductors to pass through. The conductors of loops 36A, 36B, 37A and/or 37B, for example may be reduced from the typical width of about 0.5–2 mm (about 20–40 mils) to about 0.125 mm (about 5 mil) conductors at a spacing of about 0.25 mm (about 10 mils). This is particularly helpful where the conductors 37B pass underneath electronic device 40 and the number of conductors, i.e. the number of turns of antenna 30, is restricted by the distance between contacts 42, 44 of electronic device 40. Where the width of conductors 37 or contacts 52, 54 are too small for deposition by conventional screen printing, the larger dimension features, such as the fill width portions of conductors 37A, 37B, may be deposited by mesh screen printing and the finer features, such as the narrowed portions of conductors 37A, may be deposited by stenciling, with sufficient overlap to provide reliable electrical connection.

For example, consider the dimensions (approximate) to pass eight conductors 37 of the dimensions given (which may be reduced dimensioned of narrowed conductors) under a device 40 which has its contacts 42, 44 located close to diagonally

| Conductor 37 Width | Conductor 37 Pitch | Spacing of Device 40 Contacts 42, 44 | Device 40 Edge Dimension |
|---|---|---|---|
| 100 μm (4 mils) | 200 μm (8 mils) | 1.3 mm (50 mils) | 1 mm (46 mils) |
| 125 μm (5 mils) | 200 μm (10 mils) | 1.63 mm (65 mils) | 1.3 mm (50 mils) |
| 150 μm (6 mils) | 200 μm (12 mils) | 2 mm (80 mils) | 1.3 mm (50 mils) |

Antenna portions 30A, 30B, conductive material 50 and conductive strips 52, 54 may be deposited of any suitable electrically-conductive adhesive, such as type PSS8150 flexible electrically-conductive thermoplastic adhesive available from AI Technology, which may serve as conductors 32, 36, 37, 38, 39, 50, 52, 54 as well as the contacts 52, 54 adhesive that attaches and electrically connects electronic device 40 to substrate 20. As previously described, it is preferred that the contacts of an etched or otherwise patterned metal loop 30A be coated or plated with a precious or other suitable metal to preserve the conductive and adhesion properties thereof. in addition, a suitable dielectric underfill may be employed to strengthen the attachment of electronic device 40 to substrate 20 as described above.

Articles having conductors, including articles having a plural-turn loop antenna, on both surfaces of a substrate may be formed by at least the two following methods. A substrate is provided of a conventional high-strength thermoplastic film material, such as a polyester, polyimide, polyphynylene sulfide, polysulfone, polyether sulfone, or other high-temperature resin or other suitable material. Usually, processing a sheet of substrate material of size sufficient to form an array of substrates 20 is preferred over processing substrates 20 individually, but either is acceptable. An about 25 mm by 50 mm (about 10 inch by 20 inch) or larger sheet is convenient for screen printing deposition of adhesive and is conveniently diced or cut into individual substrates, such as by rotary dicing. A pattern of holes or vias 22, 24 are cut in the substrates 20 and may be of sufficient size, e.g., about 1 mm (about 40 mils) or larger (which is comparable to the 1 mm width commonly utilized for antenna 30 conductors), as can be readily cut or punched out with suitable conventional tools, such as punches, drills and dies. Commonly available electrically-conductive inks and adhesives may then be deposited, such as by screen printing or stenciling, onto both surfaces of the sheet of substrates 20 to cover and fill holes 22, 24 as well as deposit the plural turn loop patterns of antenna portions 30A, 30B and antenna 30. After one surface of the substrate or the sheet of substrates is printed with its pattern (or geometric pattern) of conductive adhesive, the substrate or sheet is heated to dry, B-stage or cure the conductive adhesive before the other surface thereof is printed with a related pattern (or geometric pattern) of the same conductive adhesive. The printed conductive adhesive patterns on the two surfaces of the substrate or sheet are electrically connected by the conductive adhesive filling holes 22, 24, and provide suitable contact bumps or strips 52, 54 corresponding to the contacts of an electronic device 40 that provide the input and output (I/O) connections thereto. Electronic device 40 is attached to substrate 20 either while the conductive adhesive of contacts 52, 54 is wet or after it is dry or B-staged and heated to a melt-flow condition, as described above. Electrically-conductive adhesives types PSS8090, PSS150 and ESS8450 available from AI Technology are suitable for screening and/or stenciling to produce the described conductive patterns.

Alternatively, antenna portion 30A on one surface of the substrate 20 may be formed of an etched metal foil. A substrate 20 preferably of a sheet of a laminatable B-staged epoxy or other suitable laminatable structural adhesive substrate material, typically having a thickness of about 25–250 μm (about 1–10 mils) is provided, again preferably in a sheet of sufficient size to form an array of substrates 20. Preferably the sheet of substrate material is formed with a pattern of holes or vias 22, 24 therein, but holes 22, 24 may be cut with suitable conventional tools. The sheet of substrate 20 material is laminated with a sheet of a thin metal foil, for example, a metal foil of about 25–125 μm (about 1–5 mils) thickness. The metal foil is then patterned by photo-etching to form antenna 30, or antenna portion 30A using conventional photo-etching, with the ends thereof in place over and either partially or completely covering holes 22, 24. The material of substrate 20 is a material that is, when B-staged or cured, as the case may be, not adversely affected by such processing as the photo-etching and plating of the metal foil. At least the portion of the remaining metal foil at holes 22, 24 is spot plated or coated with a precious or other metal, such as silver, nickel, nickel-gold, nickel palladium, to preserve its conductivity and adhesion against degradation by oxidation, for example. An electrically-conductive ink adhesive is then printed on the second surface of the sheet of substrate material to form the pattern of antenna portion 30B, contacts 52, 54 and other conductive features thereon, as described above. Holes 22, 24 may be filled with the deposited conductive adhesive or the metal foil may be built up by plating metal thereon to fill or partially fill holes 22, 24 before the spot plating or coating of a precious or other metal thereon and deposition of the conductive adhesive, to complete a conductive connection from antenna 30, 30A to the second surface of the sheet of substrates, as described above. Electronic device 40 is attached to substrate 20 either while the conductive adhesive of contacts 52, 54 is wet or after it is dry or B-staged and heated to a melt-flow condition, as described above. Insulating thermosetting epoxy adhesive types LESP7450, ESP7450 and ME7850 are suitable for the substrate 20 material, either directly in liquid or paste form or in the form of a laminatable B-staged sheet, and electrically-conductive adhesives types PSS8090, PSS8150 and ESS8450 are suitable for screening and/or stenciling to produce the described conductive patterns, which adhesives are available from AI Technology.

Figure 6:
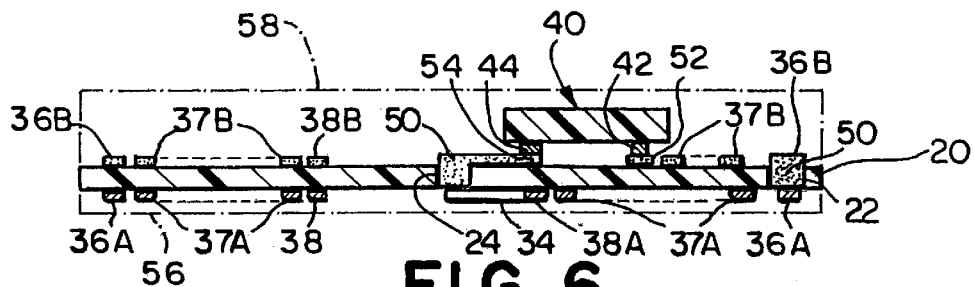
FIG. 6 is a sectional view of an article including the exemplary substrate of FIGS. 4 and 5 having an electronic device attached thereto.

Optionally, and for articles likely to encounter moisture and other potentially detrimental environments, an article according to the present invention may be covered with a layer of protective material. For example, as shown in FIG. 6, a layer 56 of an insulating adhesive may be applied to one surface of substrate 20 to cover and protect antenna portion 30A and/or a layer 58 of an insulating adhesive may be applied to the other surface of substrate 20 to cover and protect antenna portion 30B and electronic device 40. Layers 56, 58 may be applied by roll coating, screening, laminating or other suitable method, and may be covered by a layer of PVC, PET or other material, preferably a material similar to the material of substrate 20. Suitable insulating adhesives include, for example, insulating thermoplastic adhesives such as types TP7090 and MB7100, and insulating thermosetting adhesives such as types MEE7650 and ESP7450-SC, all available from AI Technology.

Figure 7:
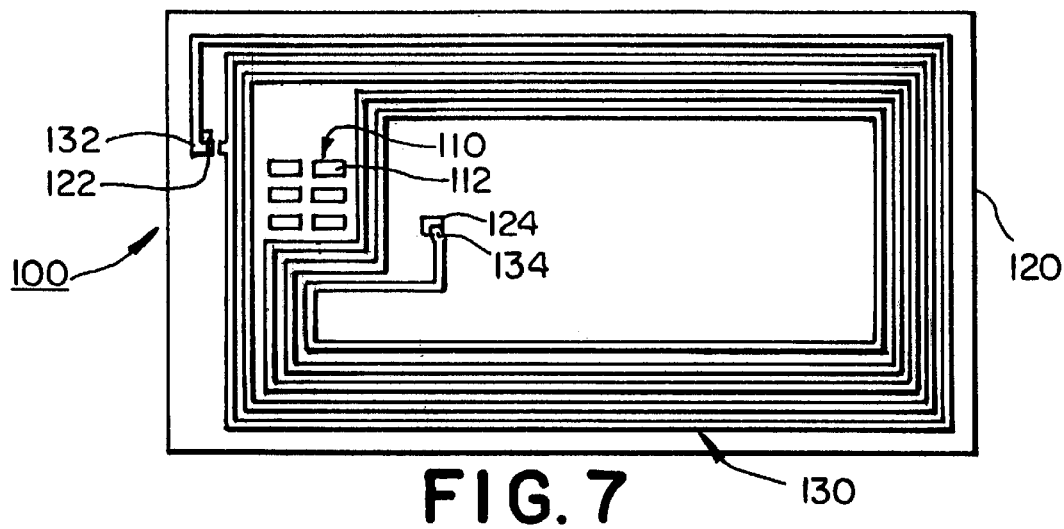
FIGS. 7 and 8 are plan views of opposing surfaces of an alternative exemplary embodiment of an article according to the present invention.
Figure 8:
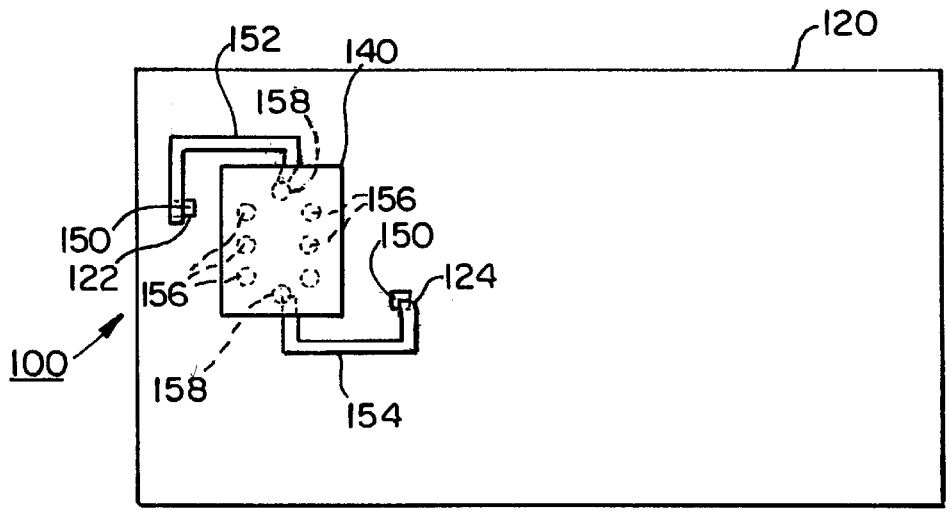

FIGS. 7 and 8 are plan views of opposing surfaces of an alternative exemplary embodiment of a wireless article 100 according to the present invention that includes, in addition to a plural turn antenna 130 for wireless communication with an external card reader by electromagnetic waves, a pattern 110 of contacts 112 located in a predetermined location on substrate 120 for making physical electrical connection to the contacts of an external card reader. The pattern 110 of metal contacts 112 are formed on one surface of substrate 120 which may be of any of the aforementioned substrate materials, but which is preferably a sheet of insulating adhesive such as type ESP7250 or ESP7450 thermosetting insulating epoxy adhesive available from AI Technology. Contacts 112 are preferably of copper applied to substrate 120, photo-etched into pattern 110, and plated with one or more layers of protective metal, such as nickel and gold layers or nickel and palladium layers, all as described above. Substrate 120 has at least two holes 122, 124 therethrough at which are located the ends or terminals 132, 134 of plural-turn antenna 130 formed on the same surface of substrate as is pattern 110 of contacts 112, and has an additional hole or via 156 (not visible in FIG. 7) located beneath each of contacts 112 for making electrical connection thereto. Preferably, plural-turn antenna 130 is located towards the edges of substrate 120 to the extent practicable in view of the required predetermined position of contact pattern 110. Antenna 130 may be formed of metal in like manner to contacts 112 or may be deposited electrically conductive material, such as an electrically-conductive adhesive, for example, types PSS8090 and PSS8150 thermosetting insulating adhesives available from AI Technology, all as described above.

A pattern of conductors 152, 154, 156, 158 is formed on the other surface of substrate 120 by depositing thereon a pattern of electrically conductive material, such as an electrically-conductive adhesive, for example, types PSS8090, PSS8150 and ESS8450 thermosetting insulating adhesives available from AI Technology, all as described above. In depositing the electrically-conductive material onto substrate 120, electrically-conductive material fills holes 122, 124, which are typically about 75–250 μm (about 3–10 mils) in diameter, to form conductive connections or vias 150 to terminals 132, 134, respectively, of antenna 130 and fills the holes beneath contacts 112, which holes are typically about 250–1000 μm (about 10–40 mils) in diameter, to form conductive connections or vias thereto providing contacts 156. Conductor 152 provides electrical connection between terminal 132 of antenna 130 and one of the contacts 158 and conductor 154 provides electrical connection between terminal 134 of antenna 130 and the other of the contacts 158. One or more additional deposits of conductive material may be made in the locations of contacts 156, 158 to increase the height thereof for facilitating attachment of an electronic device 140 thereto.

Electronic device 140 has a pattern of contacts and is attached to the other surface of substrate 120 with its pattern of contacts facing the surface of substrate 120 and adhering thereto by a plurality of electrically conductive adhesive connections to the corresponding contacts 156, 158 on substrate 120, i.e. in a flip-chip mounting manner. Certain of the contacts of electronic device 140, i.e. those arranged in two parallel rows of three contacts each, are connected through vias 156 to the contacts 112 of article 100, which are likewise arranged in two parallel rows of three contacts each. Two other contacts of electronic device 140, i.e. those not in the 2-row by 3-contact arrangement, are connected by conductors 152, 154 to plural-turn antenna 130 thereof As a result, if article 100 is inserted into a contact-type card reader, communication between the card reader and electronic device 140 is via external contacts 112 of contact pattern 110, however, if article 100 is within communication range of a wireless-type card reader, communication between the card reader and electronic device 140 is via signals transmitted and/or received via plural-turn loop antenna 130.

Prior art smart cards employ an electronic module or contact module which includes a printed circuit board with the pattern of external metal contacts on one side thereof and the back of an electronic device attached to the other side thereof The contacts of the electronic device are on the side thereof that faces away from the printed circuit board, i.e. mounting in a "contacts-away" position, and are connected thereto by fine wires bonded between via connections to the printed circuit board contacts and the contacts of the electronic device. Because the position of the prior art electronic device is reversed or flipped as between the "contacts-away" mounting arrangement of the conventional contact module and the "contacts-toward" position of electronic device 140 of article 100 described above, the prior art electronic device is not directly usable in the new article 100.

Figure 9:
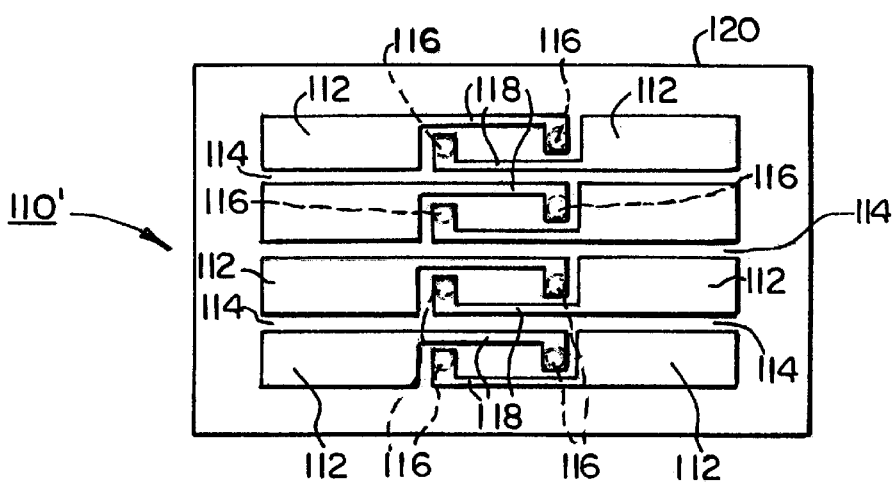
FIG. 9 is a plan view of an alternative pattern of contacts useful with the article of FIGS. 7 and 8.

FIG. 9 is a plan view of an alternative pattern 110' of external contacts 112 useful, for example, for employing the prior art electronic device with the new article 100 of FIGS. 7 and 8. Pattern 110' on substrate 120 includes interleaved conductors 118 that connect the ones of external contacts 112 on the left to corresponding ones of via contact pads 116 on the right, and alternate ones of which connect the ones of external contacts 112 on the right to corresponding ones of via contact pads 116 on the left, thereby reversing the pattern of contacts 116 with respect to the pattern 110' of external contacts. This reversal of the contact patterns effectively undoes or un-reverses the reversal of the contact pattern of electronic device 140' resulting from it being flipped from a wire-bonded "contacts-away" position to a "contacts-toward" flip-chip or chip-scale ball-grid array mounting position.

While contacts 116 to which the contacts of an electronic device connect must be on the surface of substrate 120 opposite to that on which are external contacts 112, interleaved conductors may be on either surface of substrate 120. Where conductors 118 are on the same surface of substrate as that on which are external contacts 112, they are covered by a layer of electrically-insulating material, such as an insulating adhesive, and the holes through substrate 120 that contain conductive vias are located under contacts 116. Conductors 118 and the conductive vias may be of a metal formed with contacts 112 or may be of an electrically-conductive material such as an electrically-conductive adhesive; contacts 116 are deposited on the opposite surface of substrate 120 and is of an electrically-conductive material such as an electrically-conductive adhesive. Where conductors 118 are on the surface of substrate opposite that on which are external contacts 112, holes through substrate 120 that contain conductive vias are located under contacts 120. The embodiments of articles 100' of FIGS. 7, 8 and 9 may be made of the same materials as described above in relation to wireless article 10.

It is noted that the arrangements of articles described herein may be employed in any of the articles and may be made by the methods described in U.S. patent application Ser. No. 09/412,058 (AI-TECH-11) entitled "Article Having An Embedded Electronic Device, And Method Of Making Same" filed by Kevin Kwong-Tai Chung on even date herewith, which application is hereby incorporated herein by reference in its entirety. For example, any of the articles of FIGS. 1–8 herein may be coated with a layer 56, 58 of insulating adhesive to cover and protect the antenna 30, 130 and the electronic device 40, 140 attached to substrate 20, 120, on either one or both sides of substrate 20, 120, and whether or not a card blank is or is not employed. Such wireless articles may be employed as an identification tag, an identification badge, an access card, a credit card, a debit card, a cash card, a phone card, or like article.

While the present invention has been described in terms of the foregoing exemplary embodiments, variations within the scope and spirit of the present invention as defined by the claims following will be apparent to those skilled in the art. For example, the loop antenna pattern and other features are described as being deposited as by screening, stenciling and/or masking, other methods of application such as printing, ink-jet printing, preform lamination and the like are also suitable. Further, while preferred flexible conductive and insulating adhesives are described herein, it is likewise suitable to employ rigid electrically-conductive adhesives and rigid insulating adhesives in wireless articles 10 and the manufacture thereof.

While the exemplary embodiments herein are described in relation to one electronic device 40, plural electronic devices of like or differing kinds may be attached to a single substrate, wherein the deposition of conductive adhesive that forms contact bumps or strips for the one electronic device is utilized to also deposit contact bumps or strips for any other electronic devices as well as any interconnections therebetween.

What is claimed is:

1. An article comprising:
   a substrate having two spaced apart holes therethrough;
   an elongated electrical conductor on one surface of said substrate and having two contacts at the two spaced apart holes of said substrate;
   a pattern of electrically-conductive adhesive on a second surface of said substrate and extending into the two spaced apart holes, said electrically-conductive adhesive being electrically connected to the two contacts of said elongated electrical conductor through the two spaced apart holes in said substrate and having at least one contact; and
   an electronic device attached to said substrate and having at least one contact electrically connected to the contact of said pattern of electrically-conductive adhesive.

2. The article of claim 1 wherein said elongated electrical conductor includes at least one of a deposited electrically-conductive adhesive and a metal foil.

3. The article of claim 2 wherein said metal foil is laminated to the one surface of said substrate and is patterned to define said elongated electrical conductor.

4. The article of claim 2 wherein metal is built up on said metal foil within the two spaced apart holes through said substrate.

5. The article of claim 4 wherein said built-up metal is coated with an oxidation-resistant metal.

6. The article of claim 2 wherein said elongated electrical conductor includes a spiral conductor having at least one turn.

7. The article of claim 1 wherein said pattern of electrically-conductive adhesive substantially fills the two spaced apart holes of said substrate to provide electrical connection to said elongated electrical conductor.

8. The article of claim 1 further including metal built up in the two spaced apart holes on the two contacts of said elongated electrical conductor, wherein said pattern of electrically-conductive adhesive electrically connects to said built up metal.

9. The article of claim 8 wherein said built-up metal is coated with an oxidation-resistant metal.

10. The article of claim 1 wherein said pattern of electrically-conductive adhesive is formed by one of roll coating, screen printing, stenciling, mask printing, ink jet printing and laminating an electrically conductive adhesive.

11. The article of claim 1 wherein said pattern of electrically-conductive adhesive includes a spiral conductor having at least one turn.

12. The article of claim 1 wherein the at least one contact of said electronic device is electrically connected to the contact of said pattern of electrically conductive adhesive by one of solder and an electrically-conductive adhesive.

13. The article of claim 12 wherein the electrically-conductive adhesive is deposited with said pattern of electrically-conductive adhesive and of the same electrically-conductive adhesive material.

14. The article of claim 12 wherein the electronic device is attached to said substrate while the electrically-conductive adhesive is wet.

15. The article of claim 12 wherein the electronic device is attached to said substrate after the electrically-conductive adhesive is dried or B-staged, and wherein one of said substrate and said electronic device is heated to melt flow said electrically-conductive adhesive.

16. The article of claim 12 further including a metal coating on at least the contact of the pattern of electrically-conductive adhesive to which said solder connects.

17. The article of claim 1 wherein said substrate includes one of poly-vinyl-chloride (PVC), polyimide, poly-ethylene terephthallate (PET), polybutylene terephthallate, polyester, polyester terephthallate, polymer blends, polyphynylene sulfide, polysulfone, polyether sulfone, paper film, dried insulating adhesive, and B-staged insulating adhesive.

18. The article of claim 1 further comprising an insulating adhesive underfill attaching said electronic device to said substrate.

19. An article comprising:
   a substrate having at least one hole therethrough;
   an elongated electrical conductor on one surface of said substrate and having at least one end at the hole of said substrate;
   a pattern of electrically-conductive adhesive on a second surface of said substrate and extending into the at least one hole, said electrically-conductive adhesive being electrically connected to said elongated electrical conductor through the at least one hole in said substrate and having at least one contact; and an electronic device attached to said substrate and having at least one contact electrically connected to the contact of said pattern of electrically-conductive adhesive, wherein said substrate has at least two second holes in addition to the at least one hole, further comprising a pattern of at least two electrical contacts on the one surface of said substrate, each of said two electrical contacts being at a respective one of the second holes, wherein said electrically-conductive adhesive has at least two additional contacts that are electrically connected to each of said at least two electrical contacts through the at least two second holes, respectively, wherein said electronic device has at least two second contacts electrically connected respectively to the at least two additional contacts of the electrically-conductive adhesive.

20. The article of claim 19 wherein said pattern of electrically-conductive adhesive extends into the at least two second holes of said substrate to provide electrical connection to said two electrical contacts.

21. The article of claim 19 further including metal built up in each of the two second holes on said two electrical contacts, wherein said pattern of electrically-conductive adhesive electrically connects to said built up metal.

22. The article of claim 1 further comprising at least one cover layer laminated to said substrate with insulating adhesive.

23. A wireless article comprising:
a substrate having at least first and second spaced apart holes therethrough and having first and second opposing surfaces;
an elongated electrical conductor forming a spiral having at least one turn on the first surface of said substrate and having respective first and second terminals respectively located at the first and second spaced apart holes of said substrate;
a pattern of electrically-conductive adhesive on the second surface of said substrate defining first and second contacts thereon, said pattern of electrically-conductive adhesive providing respective electrical connections to the first and second terminals of said elongated electrical conductor through the first and second spaced apart holes, respectively, in said substrate; and
an electronic device having first and second contacts attached to said substrate, wherein the first and second contacts of said electronic device are electrically connected to the first and second contacts, respectively, of said pattern of electrically-conductive adhesive.

24. The wireless article of claim 23 wherein said elongated electrical conductor includes at least one of a deposited electrically-conductive adhesive and a metal foil.

25. The wireless article of claim 24 herein said metal foil is laminated to the first surface of said substrate and is patterned to define said elongated electrical conductor.

26. The wireless article of claim 24 wherein metal is built up on said metal foil within the first and second spaced apart holes through said substrate.

27. The wireless article of claim 23 wherein said pattern of electrically-conductive adhesive extends into the first and second holes of said substrate to provide electrical connection to the first and second terminals of said elongated electrical conductor.

28. The wireless article of claim 23 further including metal built up in the first and second holes on said the first and second terminals, respectively, of said elongated electrical conductor, wherein said pattern of electrically-conductive adhesive provides respective electrical connection to the first and second terminals of said elongated electrical conductor via said built up metal.

29. The wireless article of claim 23 wherein said pattern of electrically-conductive adhesive is formed by one of roll coating, screen printing, stenciling, mask printing, ink jet printing and laminating an electrically conductive adhesive.

30. The wireless article of claim 23 wherein said pattern of electrically-conductive adhesive includes a spiral having plural turns.

31. The wireless article of claim 23 wherein the respective electrical connections of the first and second contacts of said electronic device to the first and second contacts of said pattern of eletctrically conductive adhesive each include one of solder and an electrically-conductive adhesive.

32. The wireless article of claim 31 further including a metal coating on at least the first and second contacts of the pattern of electrically-conductive adhesive to which said solder connects.

33. The wireless article of claim 31 wherein the electrical connections of electrically-conductive adhesive are deposited with said pattern of electrically-conductive adhesive and of the same electrically-conductive adhesive material.

34. The wireless article of claim 31 wherein the electronic device is attached to said substrate while the electrical connections of electrically-conductive adhesive are wet.

35. The wireless article of claim 31 wherein the electronic device is attached to said substrate after the electrical connections of electrically-conductive adhesive are dried or B-staged, and wherein one of said substrate and said electronic device is heated to melt flow said electrical connections of electrically-conductive adhesive.

36. The wireless article of claim 23 wherein said substrate includes one of poly-vinyl-chloride (PVC), polyimde, polyethylene terephthallate (PET), polybutylene terephthallate, polyester, polyester terephthallate, polymer blends, polyphynylene sulfide, polysulfone, polyether sulfone, paper film, dried insulating thermoplastic adhesive, and B-staged insulating thermosetting adhesive.

37. The wireless article of claim 23 further comprising an insulating adhesive underfill attaching said electronic device to said substrate.

38. The wireless article of claim 23 wherein said substrate has at least third and fourth spaced apart holes therethrough, further comprising a pattern of at least first and second electrical contacts on the first surface of said substrate, each of said first and second electrical contacts on the first surface of said substrate being at a respective one of the third and fourth holes, wherein said pattern of electrically-conductive adhesive defines third and fourth contacts on the second surface of said substrate that are electrically connected respectively to said at least first and second electrical contacts on the first surface of said substrate through the third and fourth holes, respectively, and wherein said electronic device has at least third and fourth contacts electrically connected respectively to the at least third and fourth contacts of the pattern of electrically-conductive adhesive.

39. The wireless article of claim 38 wherein said pattern of electrically-conductive adhesive extends into the at least third and fourth holes of said substrate to provide electrical connection to said first and second electrical contacts.

40. The wireless article of claim 38 further including metal built up in the third and fourth holes on said first and second electrical contacts, wherein said pattern of electrically-conductive adhesive electrically connects to said built up metal.

41. The wireless article of claim 23 wherein the first and second contacts of said electronic device are electrically connected respectively to the first and second contacts of said pattern of electrically conductive adhesive by one of solder and an electrically-conductive adhesive.

42. The wireless article of claim 23 further comprising at least one cover layer laminated to said substrate with insulating adhesive.

43. A wireless article having a radio frequency antenna comprising:
a planar dielectric substrate having at least first and second spaced apart holes therethrough and having first and second opposing surfaces;
an elongated electrical conductor on the first surface of said dielectric substrate including a spiral pattern having more than one turn and having first and second terminals respectively located at the first and second spaced apart holes of said dielectric substrate, wherein said elongated electrical conductor is formed of one of a deposited electrically-conductive adhesive and a metal foil;
a pattern of electrically-conductive adhesive on the second surface of said dielectric substrate defining first and second contacts thereon, said pattern of electrically-conductive adhesive including a spiral conductor having more than one turn and having first and second terminals wherein the first terminal of the spiral conductor is located at the first spaced apart hole of said dielectric substrate to provide an electrical connection to the first terminal of said elongated electrical conductor through the first spaced apart hole, wherein the second terminal of the spiral conductor connects to the first contact, and wherein the second contact connects to the second terminal of said elongated electrical conductor through the second spaced apart hole;
whereby said elongated electrical conductor and said pattern of electrically-conductive adhesive provide the radio frequency antenna; and
an electronic device having first and second contacts attached to said dielectric substrate, wherein the first and second contacts of said electronic device are electrically connected to the first and second contacts, respectively, of said pattern of electrically-conductive adhesive.

44. The wireless article of claim 43 further comprising encapsulating material encapsulating at least said electronic device to said dielectric substrate.

45. The wireless article of claim 44 wherein said encapsulating material covers at least one of said elongated electrical conductor and said pattern of electrically-conductive adhesive.

46. The wireless article of claim 44 wherein said dielectric substrate is formed of a flexible material, and wherein said encapsulating material is as least as flexible as said dielectric substrate.

47. The wireless article of claim 43 wherein said wireless article is employed as one of an identification tag, an identification badge, an access card, a credit card, a debit card, a cash card and phone card.

48. The wireless article of claim 43 further comprising a pattern of at least two external contacts on the first surface of said dielectric substrate located at third and fourth spaced apart holes through said dielectric substrate, wherein said electronic device has third and fourth contacts attached to said dielectric substrate, wherein the third and fourth contacts of said electronic device are electrically connected respectively to the at least two external contacts, respectively, of said pattern of external contacts.

49. The wireless article of claim 43 wherein said dielectric substrate is formed of a flexible material, and wherein said electrically-conductive adhesive is as least as flexible as said dielectric substrate.

50. The wireless article of claim 43 further comprising at least one additional electronic device having first and second contacts attached to said dielectric substrate, wherein the first and second contacts of said at least one additional electronic device are electrically connected to corresponding contacts of said pattern of electrically-conductive adhesive.

51. A method of making a wireless article comprising:
providing a substrate having holes therethrough and an elongated conductor on a first surface thereof having terminals of the elongated conductor extending, at least partially over the holes;
depositing electrically-conductive material in the holes to electrically connect to the elongated conductor;
depositing a pattern of electrically-conductive adhesive on a second surface of the substrate to electrically connect the elongated conductor to first and second contacts; and
attaching first and second contacts of an electronic device to the first and second contacts of the pattern of electrically-conductive adhesive on the substrate.

52. The method of claim 51 wherein said providing a substrate comprises laminating a metal foil and a sheet of substrate material, and patterning the metal foil to form the elongated conductor.

53. The method of claim 51 wherein said providing a substrate comprises depositing a substrate material onto a metal foil, forming first and second holes in the substrate material, and patterning the metal foil to form the elongated conductor.

54. The method of claim 53 including one of drying, B-staging and curing the substrate material prior to said patterning the metal foil.

55. The method of claim 53 wherein said depositing a substrate material includes depositing an insulating adhesive by one of roll coating, screen printing, stenciling, mask printing, ink jet printing and laminating.

56. The method of claim 51 wherein said providing a substrate comprises depositing an elongated conductor on the first surface a sheet of substrate material.

57. The method of claim 56 wherein said depositing an elongated conductor includes depositing a pattern of an electrically-conductive adhesive by one of roll coating, screen printing, stenciling, mask printing, and ink jet printing.

58. The method of claim 51 wherein said depositing electrically-conductive material comprises building up metal in the holes on the terminals of the elongated conductor extending over the holes.

59. The method of claim 51 wherein said depositing electrically-conductive material comprises depositing electrically-conductive adhesive into the holes through the substrate contacting the terminals of the elongated conductor extending over the holes.

60. The method of claim 51 wherein said depositing a pattern of electrically conductive adhesive includes one of roll coating, screen printing, stenciling, mask printing, and ink jet printing.

61. The method of claim 51 wherein said attaching comprises connecting the respective contacts of the electronic device and of the pattern of electrically-conductive adhesive while the electrically-conductive adhesive is wet.

62. The method of claim 51 wherein said attaching comprises drying or B-staging the pattern of electrically-conductive adhesive, heating one of the substrate and electronic device to a melt flow temperature of the electrically-conductive adhesive, and connecting the respective contacts of the electronic device and of the pattern of electrically-conductive adhesive.

63. The method of claim 51 wherein said attaching comprises coating a metal on at least the first and second contacts of the pattern of electrically-conductive adhesive, heating one of the substrate and electronic device to a melt flow temperature of solder, and connecting with solder the respective contacts of the electronic device and of the pattern of electrically-conductive adhesive.

64. A method for making an article comprising:
providing a substrate having two spaced apart holes therethrough and an elongated conductor on a first surface thereof having two terminals of the elongated conductor extending at least partially over the two spaced apart holes;
depositing a pattern of electrically-conductive adhesive on a second surface of the substrate and into the two spaced apart holes to electrically connect to the elongated conductor through the two spaced apart holes and having at least one contact; and
attaching at least one contact of an electronic device to the at least one contact of the pattern of electrically-conductive adhesive on the substrate.

65. The method of claim 64 wherein said providing a substrate comprises laminating a metal foil and a sheet of substrate material, and patterning the metal foil to form the elongated conductor.

66. The method of claim 64 wherein said providing a substrate comprises depositing a substrate material onto a metal foil, forming the two spaced apart holes in the substrate material, and patterning the metal foil to form the elongated conductor.

67. The method of claim 66 including one of drying, B-staging and curing the substrate material prior to said patterning the metal foil.

68. The method of claim 66 wherein said depositing a substrate material includes depositing an insulating adhesive by one of roll coating, screen printing, stenciling, mask printing, ink jet printing and laminating.

69. The method of claim 64 wherein said providing a substrate comprises depositing an elongated conductor on the first surface a sheet of substrate material.

70. The method of claim 69 wherein said depositing an elongated conductor includes depositing a pattern of an electrically-conductive adhesive by one of roll coating, screen printing, stenciling, mask printing, and ink jet printing.

71. The method of claim 64 further comprising depositing electrically-conductive metal in the two spaced apart holes on the two terminals of the elongated conductor extending over the two spaced apart holes.

72. The method of claim 64 wherein said depositing electrically-conductive adhesive comprises depositing electrically-conductive adhesive into and substantially filling the two spaced apart holes through the substrate contacting the two terminals of the elongated conductor extending over the two spaced apart holes.

73. The method of claim 64 wherein said depositing a pattern of electrically conductive adhesive includes one of roll coating, screen printing, stenciling, mask printing, and ink jet printing.

74. The method of claim 64 wherein said attaching comprises connecting the at least one contact of the electronic device and of the pattern of electrically-conductive adhesive while the electrically-conductive adhesive is wet.

75. The method of claim 64 wherein said attaching comprises drying or B-staging the pattern of electrically-conductive adhesive, heating one of the substrate and electronic device to a melt flow temperature of the electrically-conductive adhesive, and connecting the respective at least one contact of the electronic device and of the pattern of electrically-conductive adhesive.

76. The method of claim 64 wherein said attaching comprises coating a metal on at least the at least one contact of the pattern of electrically-conductive adhesive, heating one of the substrate and electronic device to a melt flow temperature of solder, and connecting with solder the respective at least one contact of the electronic device and of the pattern of electrically-conductive adhesive.

77. A combination contact and wireless article comprising:
a substrate having first and second opposed surfaces and having at least first, second and third spaced-apart holes therethrough;
an elongated electrical conductor providing an antenna on the first surface of said substrate and having at least one terminal at the first hole through said substrate;
a pattern of at least two electrical contacts on the first surface of said substrate, each of said two electrical contacts being at a one of the second and third holes through said substrate;
a pattern of electrically-conductive adhesive on the second surface of said substrate, said pattern of electrically-conductive adhesive defining first, second and third contacts that are electrically connected to said elongated electrical conductor and said two electrical contacts through the first, second and third holes, respectively, through said substrate; and
an electronic device attached to the second surface of said substrate and having at least three contacts electrically connected to the first, second and third contacts, respectively, of said pattern of electrically-conductive adhesive.

78. A wireless article comprising:
a substrate having at least one hole therethrough;
an elongated electrical conductor forming an antenna on one surface of said substrate and having a terminal at the at least one hole of said substrate;
a pattern of electrically-conductive adhesive on a second surface of said substrate and extending into the at least one hole,
said electrically-conductive adhesive being electrically connected to the terminal of said elongated electrical conductor through the at least one hole in said substrate, and
said electrically-conductive adhesive defining at least one contact on the second surface of said substrate; and
a flip-chip electronic device attached to the second surface of said substrate in a flip-chip manner,
said flip-chip electronic device having at least one contact facing the second surface of said substrate and electrically connected to the contact of said pattern of electrically-conductive adhesive on the second surface of said substrate.

79. A method for making a wireless article comprising:
providing a substrate having at least one hole therethrough and an elongated conductor forming an antenna on a first surface there of having a terminal of the elongated conductor extending at least partially over the at least one hole;

depositing a pattern of electrically-conductive adhesive on a second surface of the substrate and into the at least one hole to electrically connect to the terminal of the elongated conductor through the at least one hole, said deposited pattern of electrically-conductive adhesive defining at least one contact; and attaching at least one contact of a flip-chip electronic device to the at least one contact of the pattern of electrically-conductive adhesive on the second surface of the substrate in a flip-chip manner, said attaching comprising one of:

pressing the at least one contact of the electronic device against the contact of the pattern of electrically-conductive adhesive while the electrically-conductive adhesive is wet, and heating one of the substrate and electronic device to a melt flow temperature of the electrically-conductive adhesive and pressing the respective at least one contact of the electronic device against the at least one contact of the pattern of electrically-conductive adhesive.

* * * * *